United States Patent
Ono et al.

(10) Patent No.: US 7,919,824 B2
(45) Date of Patent: Apr. 5, 2011

(54) SEMICONDUCTOR DEVICE AND METHOD OF MANUFACTURING THE SAME

(75) Inventors: Syotaro Ono, Yokohama (JP); Wataru Saito, Kawasaki (JP); Nana Hatano, Yokohama (JP); Masaru Izumisawa, Himeji (JP); Yasuto Sumi, Himeji (JP); Hiroshi Ohta, Himeji (JP); Wataru Sekine, Himeji (JP); Miho Watanabe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 12/403,881

(22) Filed: Mar. 13, 2009

(65) Prior Publication Data

US 2009/0236697 A1    Sep. 24, 2009

(30) Foreign Application Priority Data

Mar. 24, 2008  (JP) .................. 2008-076588

(51) Int. Cl.
   *H01L 27/088* (2006.01)
(52) U.S. Cl. ................. 257/401; 257/367; 257/E27.069
(58) Field of Classification Search .................. 257/367, 257/401, 509, 653–654, E27.069
   See application file for complete search history.

(56) References Cited

U.S. PATENT DOCUMENTS 6,995,426 B2    2/2006    Okumura et al.

FOREIGN PATENT DOCUMENTS

| JP | 2001-298190 | 10/2001 |
|---|---|---|
| JP | 2002-343967 | 11/2002 |
| JP | 2003-224276 | 8/2003 |
| JP | 2003-258252 | 9/2003 |

*Primary Examiner* — Hoai V Pham
*Assistant Examiner* — Elias Ullah
(74) *Attorney, Agent, or Firm* — Oblon, Spivak, McClelland, Maier & Neustadt, L.L.P.

(57) ABSTRACT

A semiconductor device includes a super junction region that has a first-conductivity-type first semiconductor pillar region and a second-conductivity-type second semiconductor pillar region alternately provided on the semiconductor substrate. The first semiconductor pillar region and the second semiconductor pillar region in a termination region have a lamination form resulting from alternate lamination of the first semiconductor pillar region and the second semiconductor pillar region on the top surface of the semiconductor substrate. The first semiconductor pillar region and/or the second semiconductor pillar region at a corner part of the termination region exhibit an impurity concentration distribution such that a plurality of impurity concentration peaks appear periodically. The first semiconductor pillar region and/or the second semiconductor pillar region at a corner part of the termination region have an impurity amount such that it becomes smaller as being closer to the circumference of the corner part.

14 Claims, 11 Drawing Sheets

FIG. 5
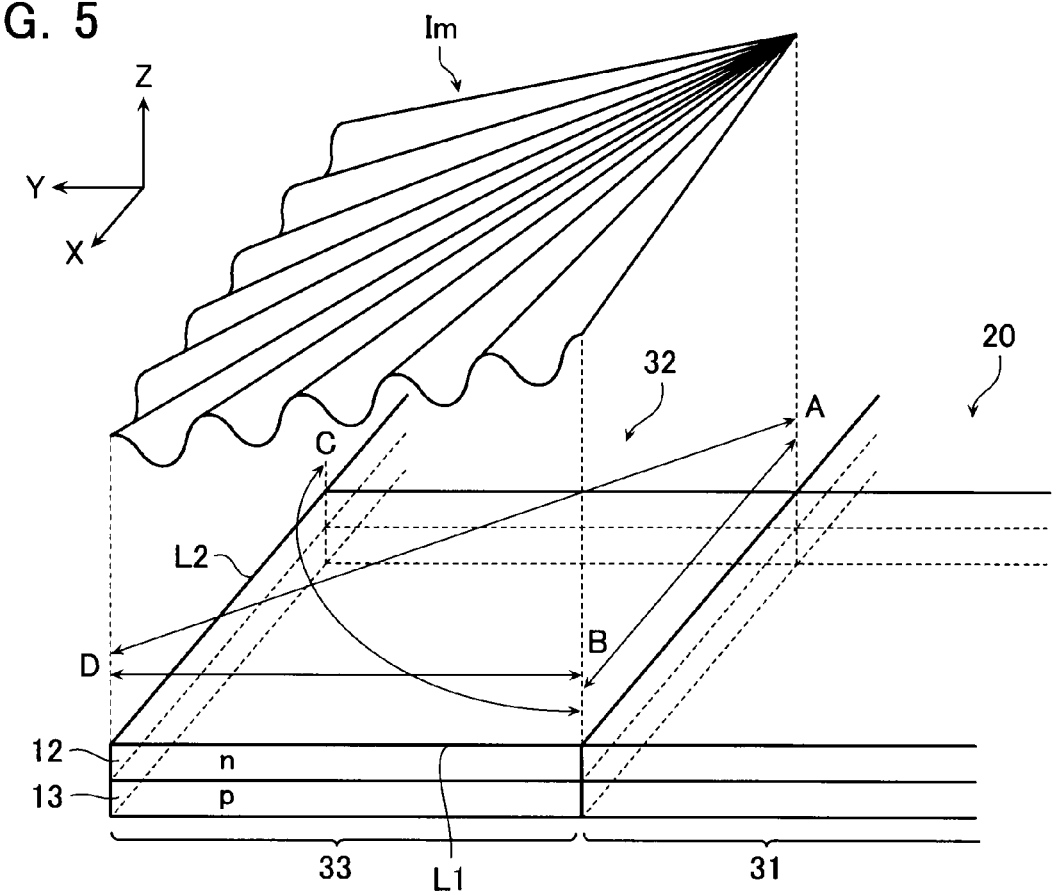
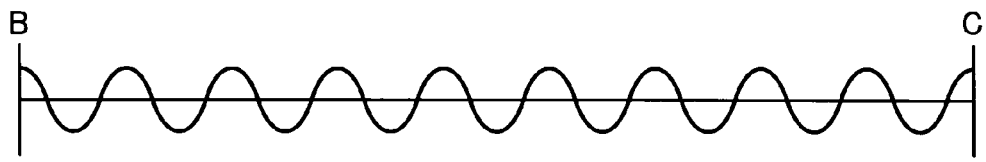
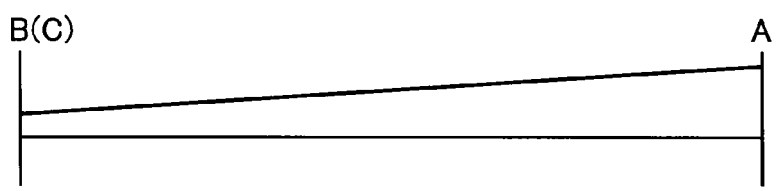
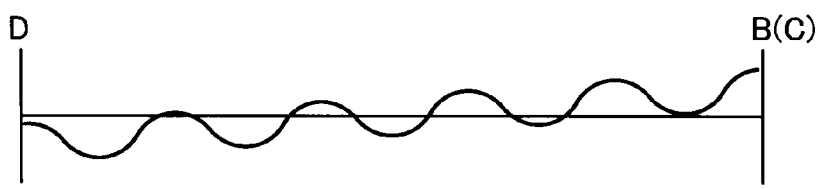
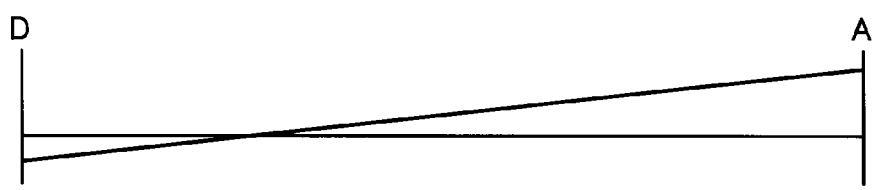

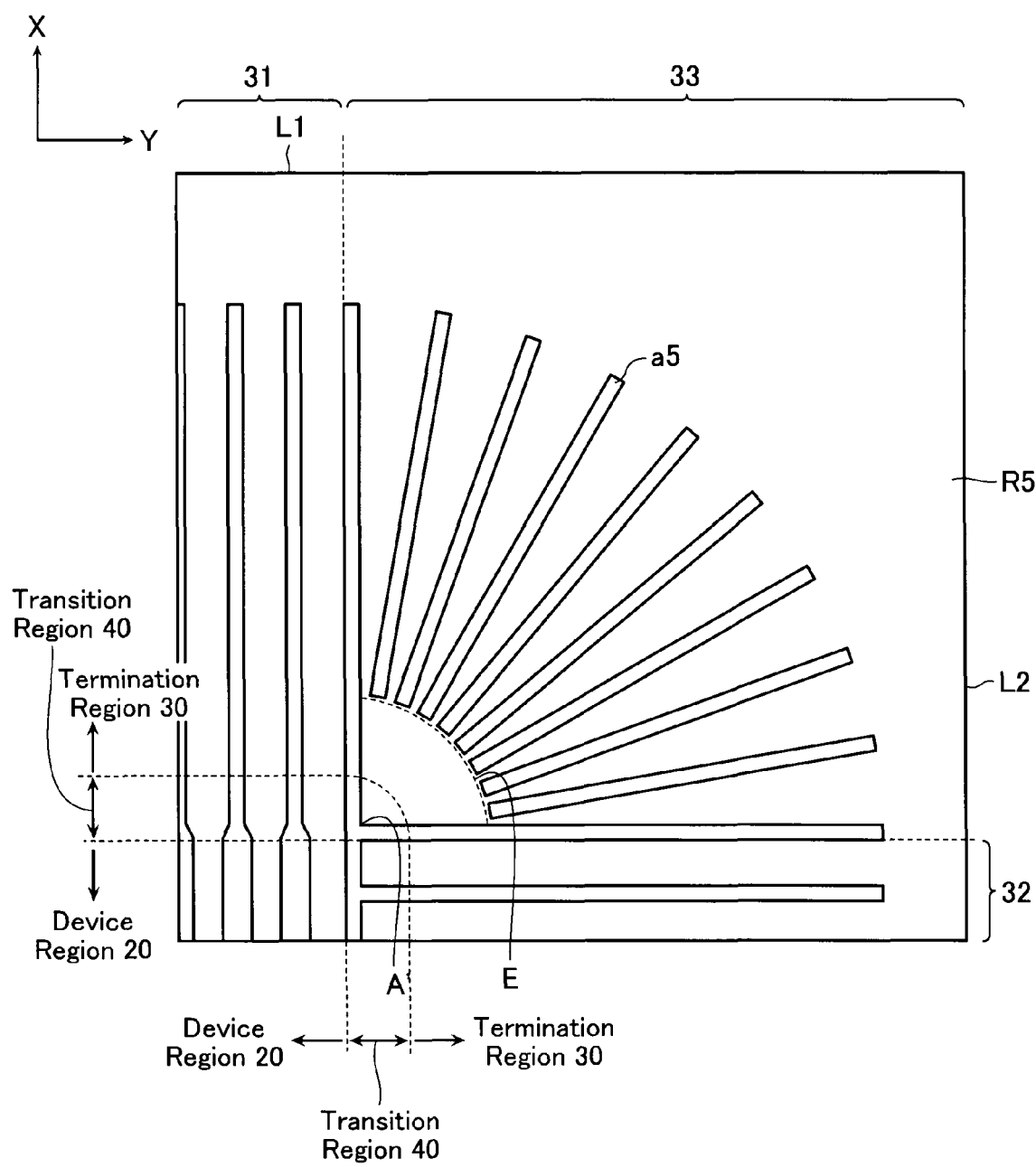

SEMICONDUCTOR DEVICE AND METHOD OF MANUFACTURING THE SAME

CROSS REFERENCE TO RELATED APPLICATIONS

This application is based on and claims the benefit of priority from prior Japanese Patent Application No. 2008-76588, filed on Mar. 24, 2008, the entire contents of which are incorporated herein by reference.

BACKGROUND OF THE INVENTION

1. Field of the Invention

The present invention relates to a semiconductor device and a method of manufacturing the same, and in particular, to a semiconductor device including a super junction region and a method of manufacturing the same.

2. Description of the Related Art

Semiconductor devices, such as MOSFET (Metal Oxide Semiconductor Field Effect Transistor) or IGBT (Insulated Gate Bipolar Transistor), which have high-speed switching characteristics and reverse blocking voltage (breakdown voltage) of tens to hundreds V, are widely used for power conversion and control in home electrical appliances, communications devices, automobile motors, and so on. To achieve smaller, higher-efficiency, and lower power consumption power systems using these semiconductor devices, MOSFET and IGBT included in the systems are, for example, required to reduce on-resistance while maintaining high breakdown voltage.

On-resistance of a vertical power MOSFET highly depends on an electrical resistance of its conductive layers (drift layers). In addition, the electrical resistance of the drift layers is determined by the impurity concentration, and smaller on-resistance may be achieved by higher impurity concentration. However, if the impurity concentration becomes higher, then the breakdown voltage in p-n junctions formed between the drift layers and base regions becomes lower. Therefore, the impurity concentration may not be higher than the limit determined depending on the breakdown voltage. Thus, there is a trade-off between the device breakdown voltage and the on-resistance. Improving the trade-off is an important issue for providing semiconductor devices with low power consumption. The trade-off has a limit determined by the device material. Overcoming such limit offers a way to the low on-resistance semiconductor devices.

One example of MOSFET that solves this problem includes a structure where vertically long reed-shaped p-type pillar regions and n-type pillar regions, referred to as a "super junction structure", are alternately embedded in the drift layers in the lateral direction. The super junction structure creates a pseudo non-doped layer by providing the same amount of charges (impurities) contained in the p-type pillar regions and the n-type pillar regions. It achieves lower on-resistance than the material limit by allowing current flow through the highly doped n-type pillar regions, while maintaining high breakdown voltage.

In off-operation of general semiconductor devices, depletion layers expand from the interfaces of the p-n junctions between p-type base regions and n-type drift layers. The semiconductor devices have such breakdown voltage that is determined by the impurity concentration in the n-type drift layers and the length of depletion layer. On the contrary, in off-operation of the semiconductor device with super junction regions, depletion layers also expand from the interfaces of the p-n junctions between p-type pillar regions and n-type pillar regions in the drift regions. Accordingly, electric field concentration may be reduced near the p-n junction surfaces between the p-type base regions and the n-type drift layers, which may provide larger electric fields in the entire drift regions. Therefore, high breakdown voltage can be obtained even if the n-type pillar regions have higher impurity concentration than the drift regions in the general semiconductor devices. On the other hand, in on-operation of the semiconductor device with super junction regions, the on-resistance may be on the order of five times smaller than that in other semiconductor devices with similar breakdown voltage, because the current flows through the high-concentration n-type pillar regions.

One method of manufacturing a semiconductor device with super junction regions includes the following steps: Firstly, n-type and p-type diffusion regions are selectively formed in a high-resistance epitaxial layer by ion implantation and diffusion, on which an additional high-resistance epitaxial layer is further laminated. Then, as in the lower layer, the step of forming n-type and p-type diffusion regions by ion implantation and diffusion is repeated multiple times. In this manufacturing method, the high-resistance epitaxial layer should be formed with a thickness such that upper n-type/p-type diffusion regions and lower n-type/p-type diffusion regions may be connected to each other.

In the semiconductor device with super junction regions, to achieve further reduction in on-resistance, it is effective to provide a smaller lateral pitch of the super junction regions. This is because providing a smaller pitch may facilitate expansion of depletion layers from the p-n junctions during a non-conduction period, and correspondingly increase the impurity concentration in the pillar regions. That is, to reduce the on-resistance of the semiconductor device, it is necessary to form the pillar regions in the super junction regions with a small width and a high aspect ratio.

In the manufacturing method mentioned above, in order to form a pillar region with a small width and a high aspect ratio, it is necessary to extend the diffusion time or to increase the number of times epitaxial growth and ion implantation steps are performed. In this manufacturing method, if ion implantation and epitaxial growth steps are repeated a larger number of times, then the number of processes correspondingly increase, which results in increased cost. Therefore, the chip area where semiconductor devices are formed must be reduced to mitigate the cost increase.

To reduce the chip area, it is necessary to achieve such low on-resistance characteristics that cannot be achieved by conventional devices, and to increase the usage current density. As can be seen, a reduction in on-resistance of the semiconductor device with the super junction regions can be achieved by pitch refinement of the pillar regions formed in the drift layers of the device region and enhancement of the impurity concentration in the pillar regions.

However, for reducing the cost of the semiconductor device with the super junction regions, reducing the area of the termination region arranged around the device region is a critical issue as well as reducing the area of the device region. The termination region is a part for sustaining high breakdown voltage by extending depletion layers towards the end of the chip where a semiconductor device is formed. It needs to be designed to prevent local electric field concentration upon avalanche breakdown, reliability test, etc. Since the termination region sustains high breakdown voltage, while the device region flows a current upon turn-on operation, the termination region is required to have larger width than the device region. This would pose difficulties in reducing its size.

On the contrary, Japanese Patent Laid-Open No. 2001-298190 discloses a semiconductor device wherein the breakdown voltage of the termination region is enhanced by changing orientations of pillar regions in the termination region, and providing smaller repetition pitch of the pillar regions in the termination region than that in the device region. In order to provide higher breakdown voltage in the termination region, it is necessary, however, that the impurity concentration of the termination region is reduced to facilitate the extension of depletion layers. According to the configuration disclosed in Japanese Patent Laid-Open No. 2001-298190, the impurity concentration increases at the corner part of the termination region since the pillar regions are uniformly provided in the termination region. Thus, it is impossible to prevent breakdown voltage reduction at the termination region, in particular, at the corner part.

SUMMARY OF THE INVENTION

One aspect of the present invention provides a semiconductor device comprising: a first-conductivity-type semiconductor substrate having mutually opposing top and bottom surfaces; a super junction region having a first-conductivity-type first semiconductor pillar region and a second-conductivity-type second semiconductor pillar region alternately provided on the semiconductor substrate; a device region having a second-conductivity-type semiconductor base region on the super junction region; and a termination region being provided on the super junction region outside of an end portion of the semiconductor base region and around a circumference of the device region, the first semiconductor pillar region and the second semiconductor pillar region in a device region having a stripe form in a first direction along the semiconductor substrate taken as a longitudinal direction, the first semiconductor pillar region and the second semiconductor pillar region in a termination region having a lamination form resulting from alternate lamination of the first semiconductor pillar region and the second semiconductor pillar region on the top surface of the semiconductor substrate, the first semiconductor pillar region and/or the second semiconductor pillar region at a corner part of the termination region exhibiting an impurity concentration distribution such that a plurality of impurity concentration peaks appear periodically along a curve proceeding from the first direction to a second direction orthogonal to the first direction at the corner part, and having an impurity amount such that it becomes smaller as being closer to the circumference of the corner part.

Another aspect of the present invention provides a semiconductor device comprising: a first-conductivity-type semiconductor substrate having mutually opposing top and bottom surfaces; a super junction region having a first-conductivity-type first semiconductor pillar region and a second-conductivity-type second semiconductor pillar region alternately provided on the semiconductor substrate; a device region having a second-conductivity-type semiconductor base region on the super junction region; and a termination region being provided on the super junction region outside of an end portion of the semiconductor base region and around a circumference of the device region, the first semiconductor pillar region and the second semiconductor pillar region in a device region having a stripe form in a first direction along the semiconductor substrate taken as a longitudinal direction, the first semiconductor pillar region and the second semiconductor pillar region in a termination region having a lamination form resulting from alternate lamination of the first semiconductor pillar region and the second semiconductor pillar region on the top surface of the semiconductor substrate, and the first semiconductor pillar region and/or the second semiconductor pillar region at a corner part of the termination region having an impurity amount such that it becomes smaller as being closer to the circumference of the corner part.

Still another aspect of the present invention provides a method of manufacturing a semiconductor device, the semiconductor device including: a first-conductivity-type semiconductor substrate having mutually opposing top and bottom surfaces; a super junction region having a first-conductivity-type first semiconductor pillar region and a second-conductivity-type second semiconductor pillar region alternately provided on the semiconductor substrate; a device region having a second-conductivity-type semiconductor base region on the super junction region; and a termination region being provided on the super junction region outside of an end portion of the semiconductor base region and around a circumference of the device region, the method comprising: as a first step, performing ion implantation of a second-conductivity-type impurity on certain positions on the device region and the termination region in a first epitaxial layer provided on the semiconductor substrate; as a second step, forming a second epitaxial layer on the first epitaxial layer; as a third step, performing ion implantation of a second-conductivity-type impurity on a certain position on the device region in the second epitaxial layer; as a fourth step, forming a third epitaxial layer on the second epitaxial layer; after repeating the first to fourth steps a certain number of times, diffusing the second-conductivity-type impurity by heat to form the super junction region; and forming the semiconductor device structure including the semiconductor base region in the device region on the semiconductor substrate, a resist being used to perform ion implantation on the termination region, the resist having apertures provided in a radial manner, at a corner part of the termination region, from the device region towards the circumference of the corner part.

BRIEF DESCRIPTION OF THE DRAWINGS

FIG. 5 illustrates the impurity concentration distribution in a termination region of the semiconductor device according to the embodiment of the present invention;

FIG. 8 is a plan view to explain another example method of manufacturing the semiconductor device according to the embodiment of the present invention.

DETAILED DESCRIPTION OF THE EMBODIMENTS

Embodiments of the present invention will now be described below with reference to the accompanying drawings. Note that the term "first-conductivity-type" refers to "n-type" and "second conductivity-type" refers to "p-type" in the following embodiments. In addition, for illustrative purposes, a semiconductor device is described in the following embodiments with reference to an n-channel planar gate type MOSFET with a super junction region.

(Configuration of Semiconductor Device)

Figure 1:
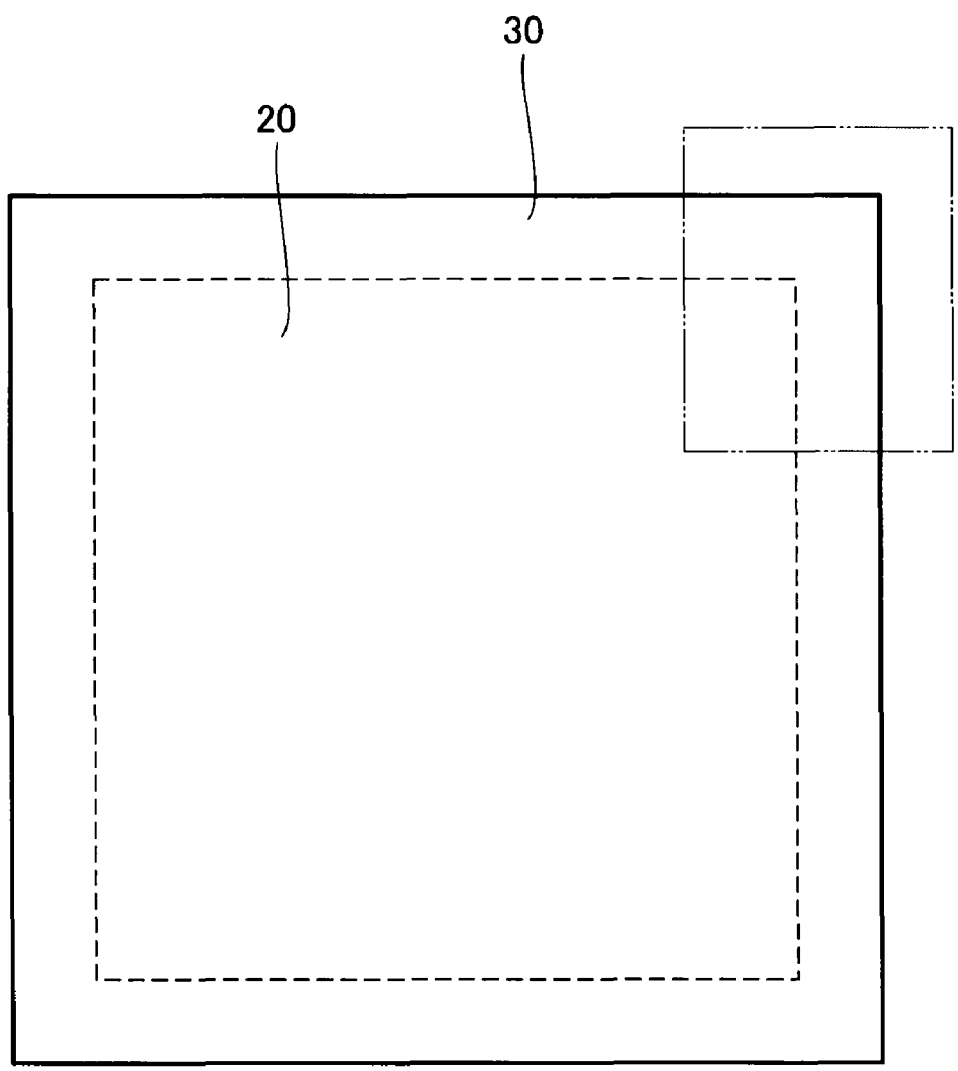
FIG. 1 is a plan view illustrating a structure of a semiconductor device according to an embodiment of the present invention.

FIG. 1 is a top plan view illustrating an entire chip on which a semiconductor device according to an embodiment of the present invention is formed. Provided on the chip of FIG. 1 are, for example, a device region 20 in which a semiconductor device such as MOSFET is formed, and a termination region 30 that is formed to surround the circumference of the device region 20.

Figure 2:
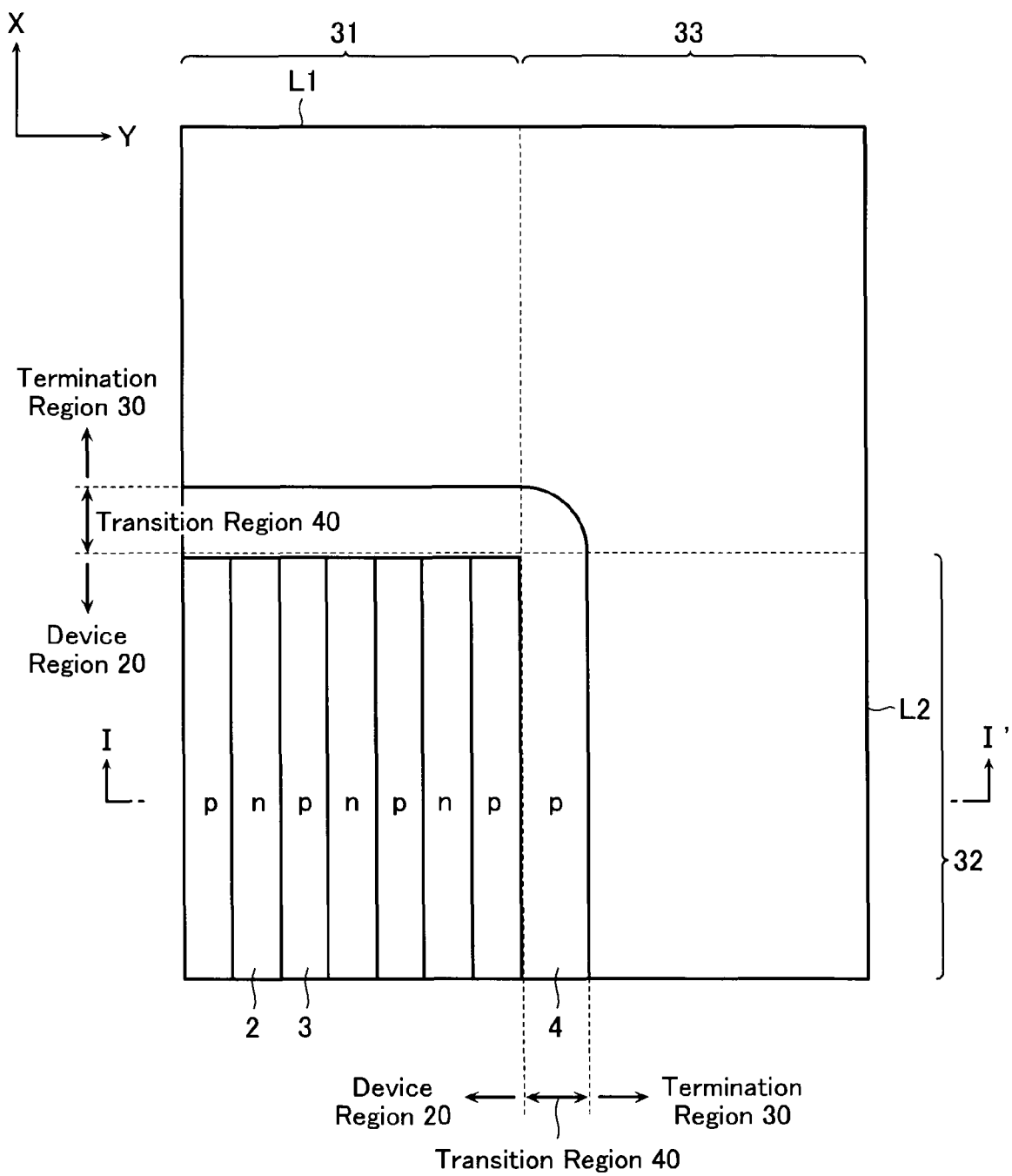
FIG. 2 is a plan view illustrating the structure of the semiconductor device according to the embodiment of the present invention.
Figure 3:
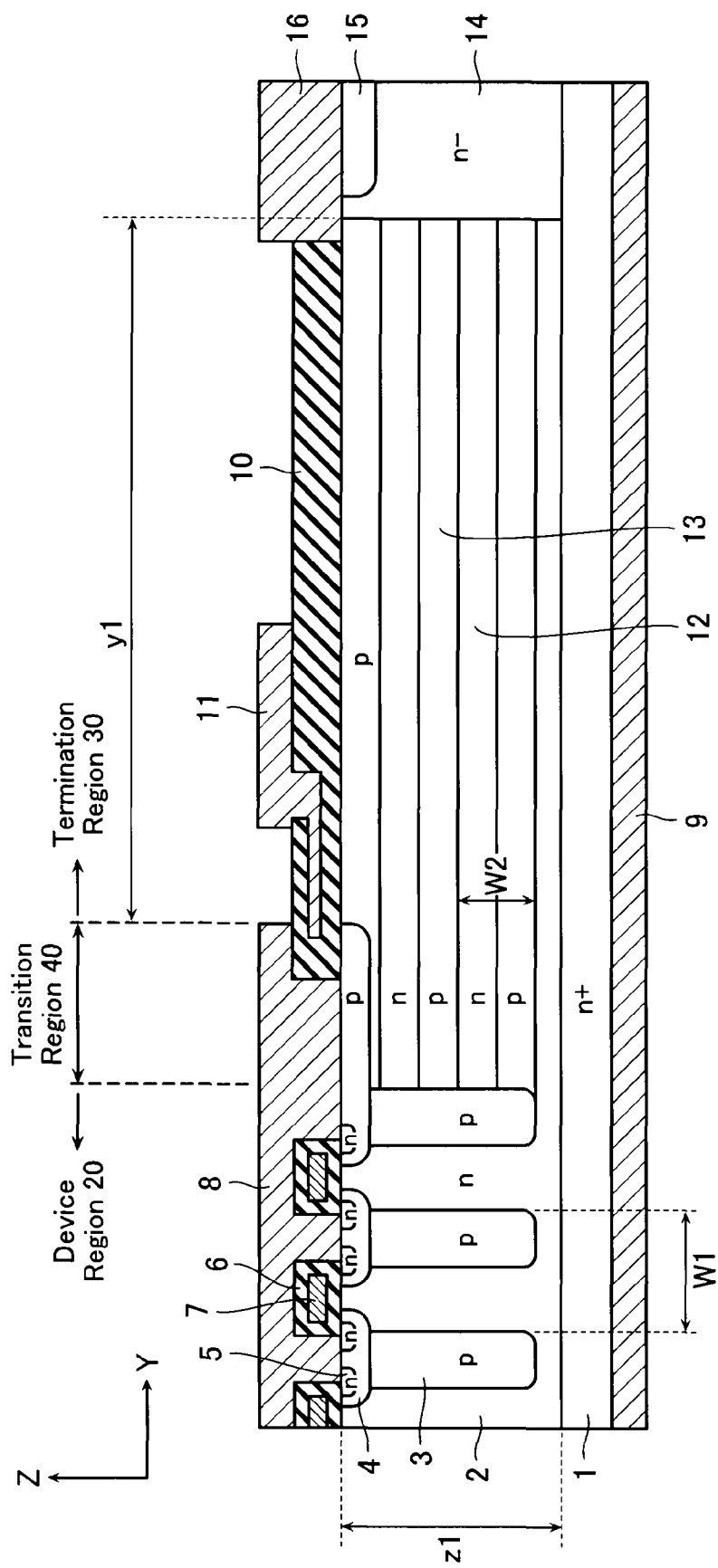
FIG. 3 is a cross-sectional view illustrating the structure of the semiconductor device according to the embodiment of the present invention.

FIG. 2 is an enlarged top plan view of the termination region 30, including a corner part of the chip on which the semiconductor device is formed, as indicated by the dashed-two dotted line of FIG. 1. FIG. 2 is a top plan view along the X-Y plane of the semiconductor device according to this embodiment. FIG. 3 is a cross-sectional view taken along the line I-I' of FIG. 2, illustrating a typical configuration of the semiconductor device according to this embodiment. FIGS. 2 and 3 illustrate the device region 20 and the termination region 30 of the chip on which the semiconductor device is formed. In addition, as illustrated in FIG. 2, the termination region 30 includes the following parts: a peripheral part 31 formed along a circumference L1 of the termination region 30 in the y direction; a peripheral part 32 formed along a circumference L2 of the termination region in the x direction; and a corner part 33 formed by the circumferences L1 and L2 of the termination region. In addition, a transition region 40 where a p-type base region 4 described later is extending from device region 20 is provided between the device region 20 and termination region 30.

As illustrated in FIG. 3, the semiconductor device according to this embodiment has mutually opposing top and bottom surfaces, and is formed on an $n^+$ type semiconductor substrate 1 of, e.g., silicon (Si). Provided in the device region 20 on the $n^+$ type semiconductor substrate 1 are n-type pillar regions 2 and p-type pillar regions 3 with vertically long reed-shaped cross-sections. The n-type pillar regions 2 and the p-type pillar regions 3 are alternately provided in a lateral direction (the y direction of FIG. 3) along the top surface of the $n^+$ type semiconductor substrate 1, forming together a stripe-shaped super junction region, with a first direction (the x direction of FIG. 2) taken as the longitudinal direction. In addition, the p-type base regions 4 are provided on the repeatedly provided p-type pillar regions 3. Further, n-type source layers 5 are selectively provided on the top surfaces of the p-type base regions 4 in a stripe form, with a vertical direction to the drawing taken as the longitudinal direction.

Note that, in the case of FIG. 3, the bottom portions of the p-type pillar regions 3 are not in contact with the $n^+$ type semiconductor substrate 1, and that parts of the n-type pillar regions 2 extend between the bottom portions of the p-type pillar regions 3 and the $n^+$ type semiconductor substrate 1. Alternatively, the bottom portions of the p-type pillar regions 3 may be configured to come in contact with the $n^+$ type semiconductor substrate 1. The p-type base region 4 is extended from the device region 20 for improving breakdown voltage characteristics. The area where the p-type base region 4 is extended becomes the transition region 40.

In addition, gate electrodes 7 are formed in a stripe form on the n-type source layers 5 and the p-type base regions 4 via gate insulation films 6. As illustrated in FIG. 3, the gate insulation films 6 and the gate electrodes 7 may be commonly formed on two neighboring p-type pillar regions 3 across one n-type pillar region 2. In addition, the gate insulation films 6 may use silicon oxide films of 0.1 μm thickness, for example. The gate electrodes 7 form channels in the p-type base regions 4 upon application of gate voltage that is equal to or greater than the threshold voltage, thereby making MOSFET conductive.

Further, a source electrode 8 is commonly formed on the p-type base regions 4 and the n-type source layers 5 for each MOSFET, so that it is connected to the n-type source layers 5 and electrically connected to the p-type pillar regions 3 via the p-type base regions 4. The source electrode 8 is insulated from the gate electrodes 7 by the gate insulation films 6, etc. In addition, a drain electrode 9 is provided common to multiple MOSFET, so that it is electrically connected to the bottom surface of the $n^+$ type semiconductor substrate 1. An insulation film 10 is formed on the termination region 30 of the semiconductor device.

A field plate electrode 11 is provided on the insulation film 10 provided in the termination region 30 of the semiconductor device. The field plate electrode 11 is connected to the source electrode 8 or the gate electrodes 7, and has the same potential as the source electrode 8 or the gate electrodes 7. If drain voltage increases when the MOSFET are not conducting, the field plate electrode 11 acts to cause a depletion layer to extend in a lateral direction (the y direction of FIG. 3) to suppress the electric fields applied to the ends of the p-type base regions 4, thereby increasing the breakdown voltage. In addition, a field stop region 15 is provided in an n-type region 14 at the end of the termination region 30 and connected to a field stop electrode 16.

In the termination region 30, n-type pillar regions 12 and p-type pillar regions 13 are formed to be alternately laminated parallel to the $n^+$ type semiconductor substrate 1. In addition, at the cross-section of FIG. 3, the super junction region in the termination region 30 including the n-type pillar regions 12 and the p-type pillar regions 13 are formed in a direction orthogonal to the n-type pillar regions 2 and the p-type pillar regions 3 formed in the device region 20, which direction is taken as the longitudinal direction.

Figure 4:
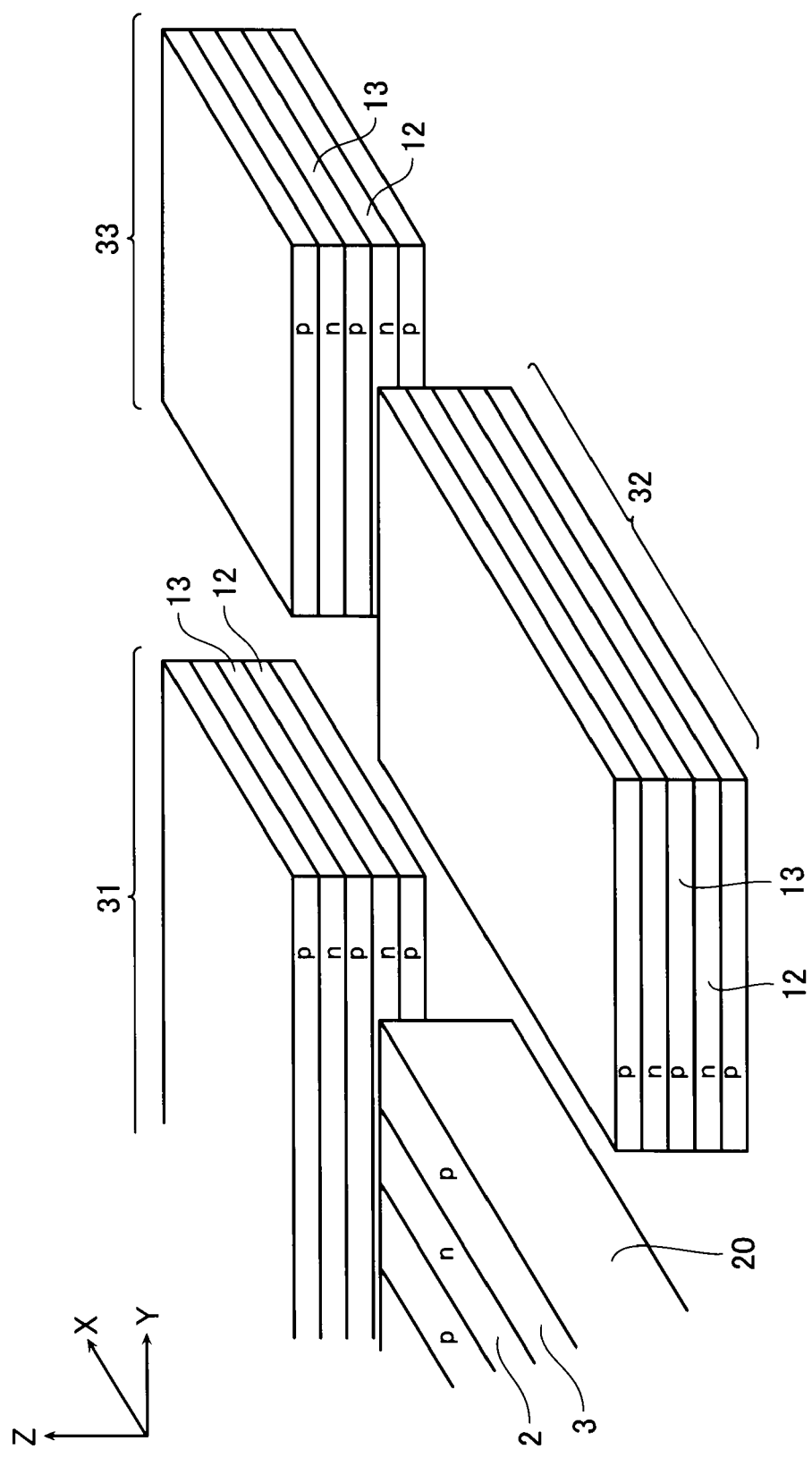
FIG. 4 is an exploded perspective view illustrating the structure of the semiconductor device according to the embodiment of the present invention.

FIG. 4 is an exploded perspective view illustrating a super junction region formed in the device region 20 and the termination region 30, respectively, in the semiconductor device according to this embodiment. As illustrated in FIGS. 3 and 4, the semiconductor device according to this embodiment has a super junction region formed not only in the device region 20, but also in the termination region 30 on the circumference thereof.

In the peripheral parts 31 and 32 of the termination region 30, n-type pillar regions 12 and p-type pillar regions 13 are formed to be alternately laminated parallel to the $n^+$ type semiconductor substrate 1. Each of the n-type pillar regions 12 and the p-type pillar regions 13 has a planar plate-like structure on the $n^+$ type semiconductor substrate 1. The p-type pillar regions 13 in the peripheral part 32 are contacted and connected to one of the p-type pillar regions 3 that is formed on the outermost circumference of the device region 20. In addition, the p-type pillar regions 13 in the peripheral part 31 are contacted and connected to the respective p-type pillar regions 3 that are formed in a stripe form in the device region 20.

As illustrated in FIG. 4, also at the corner part 33 of the termination region 30, n-type pillar regions 12 and p-type pillar regions 13 are formed to be alternately laminated parallel to the $n^+$ type semiconductor substrate 1, as well as in the peripheral parts 31 and 32. The n-type pillar regions 12 and the p-type pillar regions 13 at the corner part 33 of the termination region 30 have a planar plate-like structure connected to n-type pillar regions 12 and p-type pillar regions 13 in the peripheral parts 31 and 32.

In this case, as illustrated in FIG. 3, a width W2, which is one repetition unit in the vertical direction of a n-type pillar region 12 and a p-type pillar region 13 provided in the termination region 30, is smaller than a width W1, which is one repetition unit in the lateral direction of a n-type pillar region 2 and a p-type pillar region 3 provided in the device region 20. In addition, the termination region 30 has the n-type pillar regions 12 and the p-type pillar regions 13 with higher impurity concentration than that of the n-type pillar regions 2 and the p-type pillar regions 3 in the device region 20. Further, the impurity concentration of n-type impurities implanted into the respective n-type pillar regions 12 in the termination region 30 is substantially the same as that of p-type impurities implanted into the respective p-type pillar regions 13. Each n-type pillar region 12 and p-type pillar region 13 in the termination region 30 are connected to respective pillar regions located above and below itself, with an impurity concentration equal to or greater than $1\times10^{14}$ atom/cm$^3$.

The impurity concentration distribution in the corner part 33 of the termination region 30 will now be described below. FIG. 5 illustrates the impurity concentration distribution in the corner part 33 of the termination region 30 of the semiconductor device according to this embodiment. The upper section of FIG. 5 illustrates the impurity concentration distribution Im of the n-type pillar region 12 provided at the corner part 33 in association with the corner part 33. In this case, a higher point on the impurity concentration distribution Im indicates a higher impurity concentration state. The lower section of FIG. 5 illustrates the change in impurity concentration of the n-type pillar region 12, along a line segment or curve connecting four corners (A, B, C, D) of the corner part 33.

As illustrated in the upper section of FIG. 5, the impurity concentration distribution in the corner part 33 of the termination region 30 has a wave shape in which a plurality of bands of impurity concentration peak are formed. As indicated by the change in impurity concentration along an arc BC centered at a contact point A between the corner part 33 and the device region 20, in the lower section of FIG. 5, multiple impurity concentration peaks repeatedly appear at a certain pitch, along a curve proceeding from the x direction to the y direction.

In addition, a band of impurity concentration peaks expands in a continuous manner from the point A towards two straight lines L1 and L2 forming the corner part 33. In other words, the impurity concentration distribution in the n-type pillar regions 12 at the corner part 33 of the termination region 30 provides impurity concentration peaks in a radial manner from the device region 20 towards the circumferences L1 and L2 of the corner part 33.

As indicated by the impurity concentration along respective line segments AB (or AC) and AD in the lower section of FIG. 5, the n-type pillar regions 12 formed at the corner part 33 of the termination region 30 have a lower impurity concentration as being closer to the circumferences L1 and L2 of the termination region 30 from the point A.

In addition, as indicated by the impurity concentration distribution along a line segment BD (or CD) in the lower section of FIG. 5, the n-type pillar regions 12 formed at the corner part 33 of the termination region 30 exhibit a waveshaped impurity concentration distribution along the circumferences L1 and L2 of the corner part 33, and they are formed with a lower impurity concentration as being closer to the corner D of the corner part 33.

In other words, the n-type pillar regions 12 at the corner part 33 of the termination region 30 have such impurity concentration distribution that exhibits the highest impurity concentration at the point A, the center point of the sector form, while exhibiting a lower impurity concentration in a direction from the point A towards the circumferences L1 and L2, as being closer to the arc of the sector form.

In addition, the n-type pillar regions 12 at the corner part of the termination region 30 are provided so that the total amount of n-type impurities implanted into the n-type pillar regions 12 decreases as being closer to the circumferences L1 and L2 of the corner part 33.

In this case, the n-type pillar regions 12 at the corner part 33 of the termination region 30 are provided with a lower impurity concentration than that of the n-type pillar regions 2 in the device region 20, even at the location of the highest impurity concentration. Thus, the n-type pillar regions 12 and the p-type pillar regions 13 in the termination region 30 have a lower impurity concentration than that of the n-type pillar regions 2 and the p-type pillar regions 3 in the device region 20, respectively.

While the previous description is provided with reference to the impurity concentration distribution in the n-type pillar regions 12, the impurity concentration distribution of p-type impurities implanted into the p-type pillar regions 13 in the termination region 30 exhibits a similar pattern to that in the n-type pillar region 12. That is, the impurity concentration distribution of the p-type pillar regions 13 at the corner part 33 provides impurity concentration peaks in a radial manner from the device region 20 towards the circumferences L1 and L2 of the corner part 33. In addition, the p-type pillar regions 13 at the corner part 33 of the termination region 30 are provided with a lower impurity concentration than that of the p-type pillar regions 3 in the device region 20, even at the location of the highest impurity concentration.

Referring now to FIGS. 2 and 3, the operation of the semiconductor device will be described below. In this operation, it is assumed that the n-type source layers 5 and the p-type base regions 4 of the MOSFET formed in the device region 20 are grounded via the source electrode 8. It is also assumed that a certain positive voltage is applied to the n+type semiconductor substrate 1 corresponding to the drain region, via the drain electrode 9.

Upon on-operation of the semiconductor device, a certain positive voltage (i.e., a gate voltage not less than the threshold voltage) is applied to the gate electrodes 7 of the respective MOSFET. As a result, n-type inversion layers are formed in channel regions of the p-type base regions 4. The electrons from the n-type source layers 5 are then injected through the inversion layers to the n-type pillar regions 2 corresponding to the drift regions, reaching the $n^+$ type semiconductor substrate 1 of the drain region. Consequently, current flows from the $n^+$ type semiconductor substrate 1 to the n-type source layers 5.

Alternatively, upon off-operation of the semiconductor device, the voltage to be applied to the gate electrodes 7 is controlled so that the gate voltage applied to the gate electrodes 7 of the respective MOSFET is not more than the threshold voltage. This eliminates the inversion layers in the channel regions of the p-type base regions 4, which results in termination of electron injection from the n-type source layers 5 into the n-type pillar regions 2. Thus, the current no longer flows from the $n^+$ type semiconductor substrate 1 corresponding to the drain region to the n-type source layers 5. Further, during off-operation, the breakdown voltage of the semiconductor device is sustained by depletion layers, extending in the lateral direction from the interfaces of the p-n junctions formed between the n-type pillar regions 2 and the p-type pillar regions 3.

The p-type pillar regions 13 in the termination region 30 are connected to the p-type pillar regions 3 in the device region 20, which prevents the p-type pillar regions 13 from assuming a floating potential during off-operation. In addition, the n-type pillar regions 12 in the termination region 30 are connected to the drain electrode 9 via the n-type region 14 on the outermost circumference. Thus, during the off-operation of the semiconductor device, depletion layers are also formed to extend from the p-type pillar regions 13 in the termination region 30 as well. The depletion layers extend from the respective p-type pillar regions 13 provided horizontally on the $n^+$ type semiconductor substrate 1, towards the n-type pillar regions 12 located thereon and thereunder. Multiple depletion layers are also formed to extend from the respective p-type pillar regions 13 towards the n-type pillar regions 12 located thereon and thereunder at the corner part 33 of the termination region 30. The termination region 30 can easily be depleted due to the multiple depletion layers extending in a direction perpendicular to the $n^+$ type semiconductor substrate 1 (the z direction of FIG. 3). This may prevent the depletion layers from having a large curvature at the ends of the p-type base regions 4 and mitigate the electric fields concentration.

Further, the n-type pillar regions 12 and the p-type pillar regions 13 in the termination region 30 have a lower impurity concentration than that of the n-type pillar regions 2 and the p-type pillar regions 3 in the device region 20. Accordingly, this facilitates the extension of depletion layers in the termination region 30 and enables the termination region 30 to have a higher breakdown voltage than the device region 20.

In addition, the impurity concentration of n-type impurities implanted into the respective n-type pillar regions 12 in the termination region 30 is substantially the same as that of p-type impurities implanted into the respective p-type pillar regions 13, which may prevent breakdown voltage reduction caused by a disruption of charge balance in the pillar regions of the termination region 30.

Further, the corner part 33 may provide higher breakdown voltage because the troughs in the radial impurity concentration distribution of the n-type pillar regions 12 and the p-type pillar regions 13 provided at the corner part 33 of the termination region 30 represent still lower impurity concentration than the average impurity concentration of the corner part 33. In addition, since the total amount of impurities implanted into the n-type pillar regions 12 and the p-type pillar regions 13 decreases as being closer to the circumferences L1 and L2 of the corner part 33, the n-type pillar regions 12 and the p-type pillar regions 13 tend to be depleted more rapidly as being closer to the circumferences L1 and L2, which may provide higher breakdown voltage.

Although, in FIG. 3, the semiconductor device of this embodiment is illustrated with a different ratio, a length y1 of the termination region 30 from an end portion of the p-type base region 4 to an end portion of the super junction region at the circumference side in a lateral direction (the y direction of FIG. 3) may be similar to a thickness z1 of the drift region in the device region 20. In view of reliability, for example, the length y1 in the lateral direction (the y direction of FIG. 3) of the termination region 30 may be larger than the length z1 in the vertical direction (the z direction of FIG. 3) of the n-type pillar regions 2, by a factor of about 1.1 to 1.5.

(Manufacturing Method of Semiconductor Device)

A manufacturing method of the semiconductor device according to this embodiment will now be described below. FIGS. 6A to 7B are enlarged plan views illustrating the termination region 30 including the corner part 33 of the chip on which the semiconductor device of this embodiment is formed.

Figure 6A:
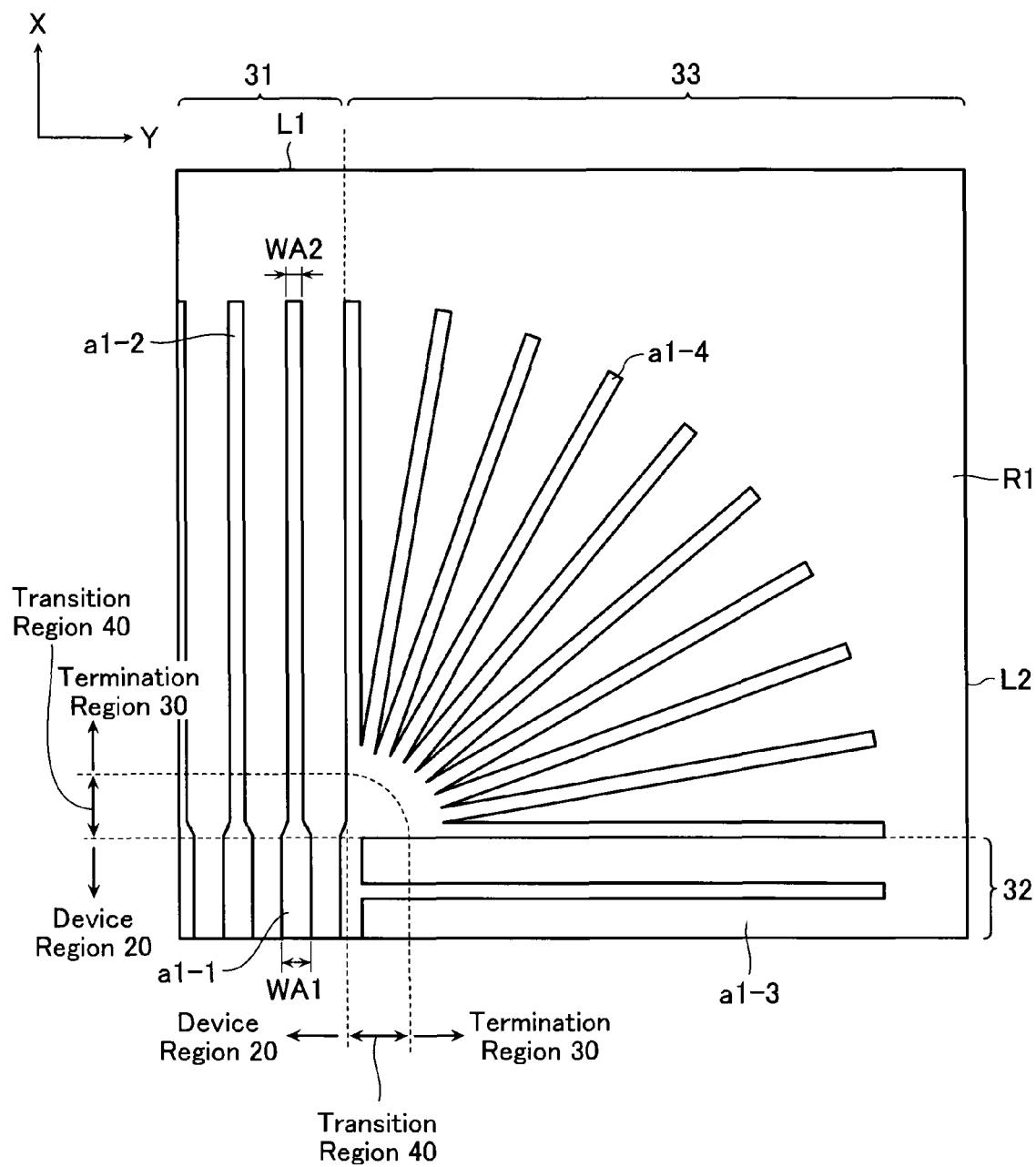
FIG. 6A is a plan view to explain a method of manufacturing the semiconductor device according to the embodiment of the present invention.

Firstly, for example, an oxide film is formed as a protection film on an n-type epitaxial layer on the $n^+$ type semiconductor substrate 1. Then, as illustrated in FIG. 6A, a resist R1 is formed with apertures a1-1 to a1-4. The resist R1 has the apertures a1-1 in the device region 20 of the chip on which the semiconductor device is formed, and the apertures a1-2 to a1-4 in the termination region 30.

The apertures a1-1 in the resist R1 in the device region 20 are provided in a lateral direction (the y direction of FIG. 6A) along the top surface of the $n^+$ type semiconductor substrate 1, providing a stripe form with a first direction (the x direction of FIG. 6A) taken as the longitudinal direction.

As in the apertures a1-1 in the device region 20, the apertures a1-2 in the resist R1, at the peripheral part 31 of the termination region 30, also have a stripe form with the first direction (the x direction of FIG. 6A) taken as the longitudinal direction. In this case, the apertures a1-2 at the peripheral part 31 have aperture widths WA2 smaller than aperture widths WA1 of the apertures a1-1 in the device region 20.

The apertures a1-3 in the resist R1 at the peripheral part 32 of the termination region 30 have a stripe form with a direction orthogonal to the circumference L2 of the termination region 30 (the y direction of FIG. 6A) taken as the longitudinal direction. The apertures a1-3 at the peripheral part 32 have aperture widths substantially the same as aperture widths WA2 of the apertures a1-2 of the peripheral part 31.

At the corner part 33 of the termination region 30, the apertures a1-4 in the resist R1 are provided in a radial manner from the device region 20 towards the circumferences L1 and L2 of the corner part 33. The apertures a1-4 at the corner part 33 have aperture widths substantially the same as the aperture widths WA2 of the apertures a1-2 of the peripheral part 31.

Using the resist R1 as a mask, an ion implantation device performs ion implantation of p-type impurities, e.g., boron (B), into the n-type epitaxial layer on the semiconductor substrate 1.

Figure 6B:
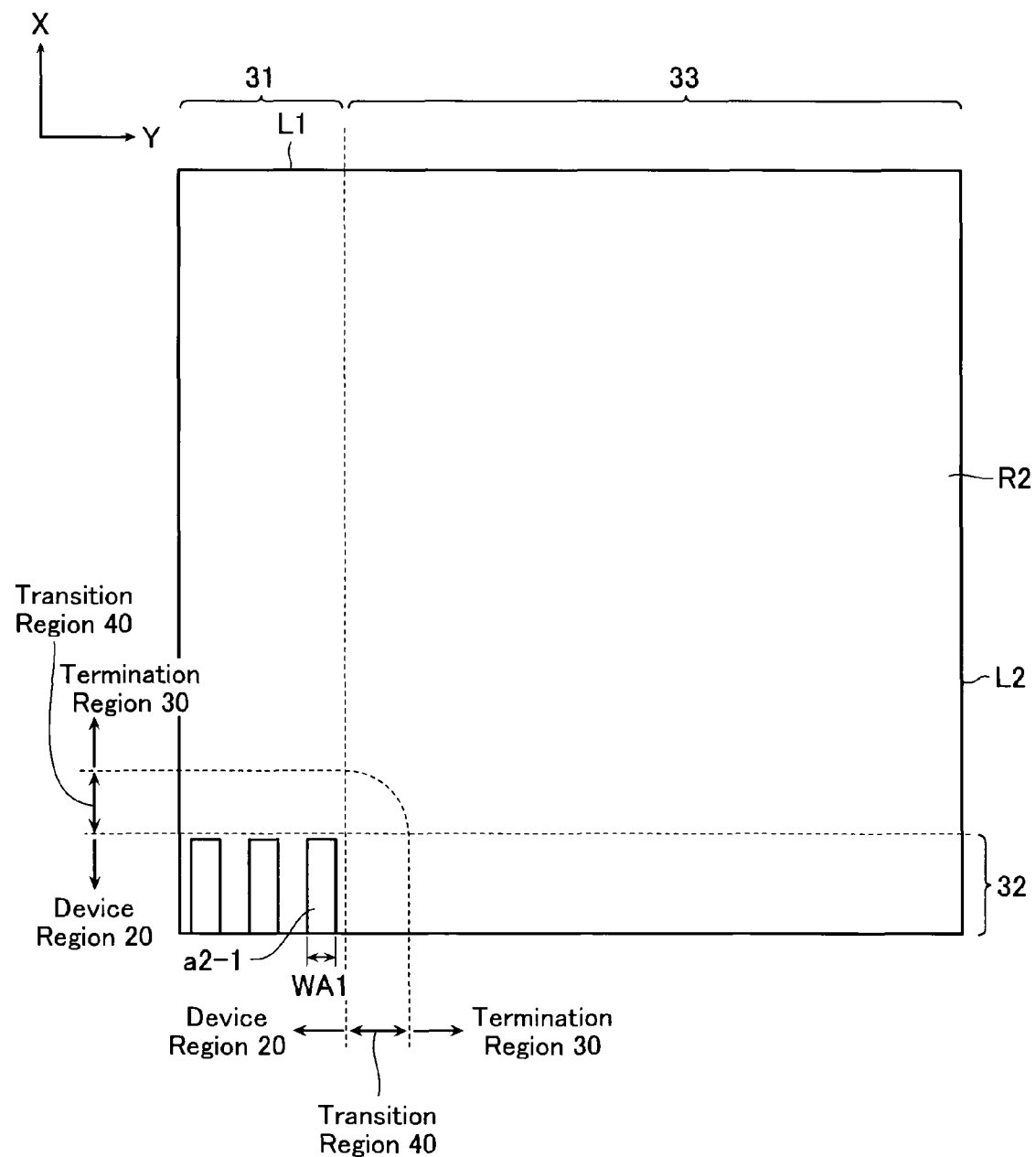
FIG. 6B is a plan view to explain the method of manufacturing the semiconductor device according to the embodiment of the present invention.

Then, after the resist R1 is stripped, a resist R2 with apertures a2-1 is formed as illustrated in FIG. 6B. The resist R2 has the apertures a2-1 only in the device region 20 of the chip on which the semiconductor device is formed.

As in the apertures a1-1, the apertures a2-1 in the resist R2 in the device region 20 are provided in a lateral direction (the y direction of FIG. 6B) along the top surface of the $n^+$ type semiconductor substrate 1, providing a stripe form with a first direction (the x direction of FIG. 6B) taken as the longitudinal direction. In this case, in the device region 20, the apertures a2-1 are provided to be offset from the apertures a1-1 in the resist R1 by half a pitch, and they have the same aperture widths WA1 as the apertures a1-1.

Using the resist R2 as a mask, the ion implantation device performs ion implantation of n-type impurities, e.g., phosphorus (P), into the n-type epitaxial layer on the semiconductor substrate 1. In the device region 20, since the apertures a2-1 in the resist R2 are offset from the apertures a1-1 in the resist R1 by half a pitch, n-type impurities are implanted into the intermediate points of the previously implanted p-type impurities. This forms a part of the super junction structure formed by an n-type pillar region 2 and a p-type pillar region 3.

Subsequently, after removing the oxide film and the resist R2, an n-type epitaxial layer is formed on the top surface of the $n^+$ type semiconductor substrate 1 with a thickness of, e.g., on the order of 5.0 to 10.0 μm.

Figure 7A:
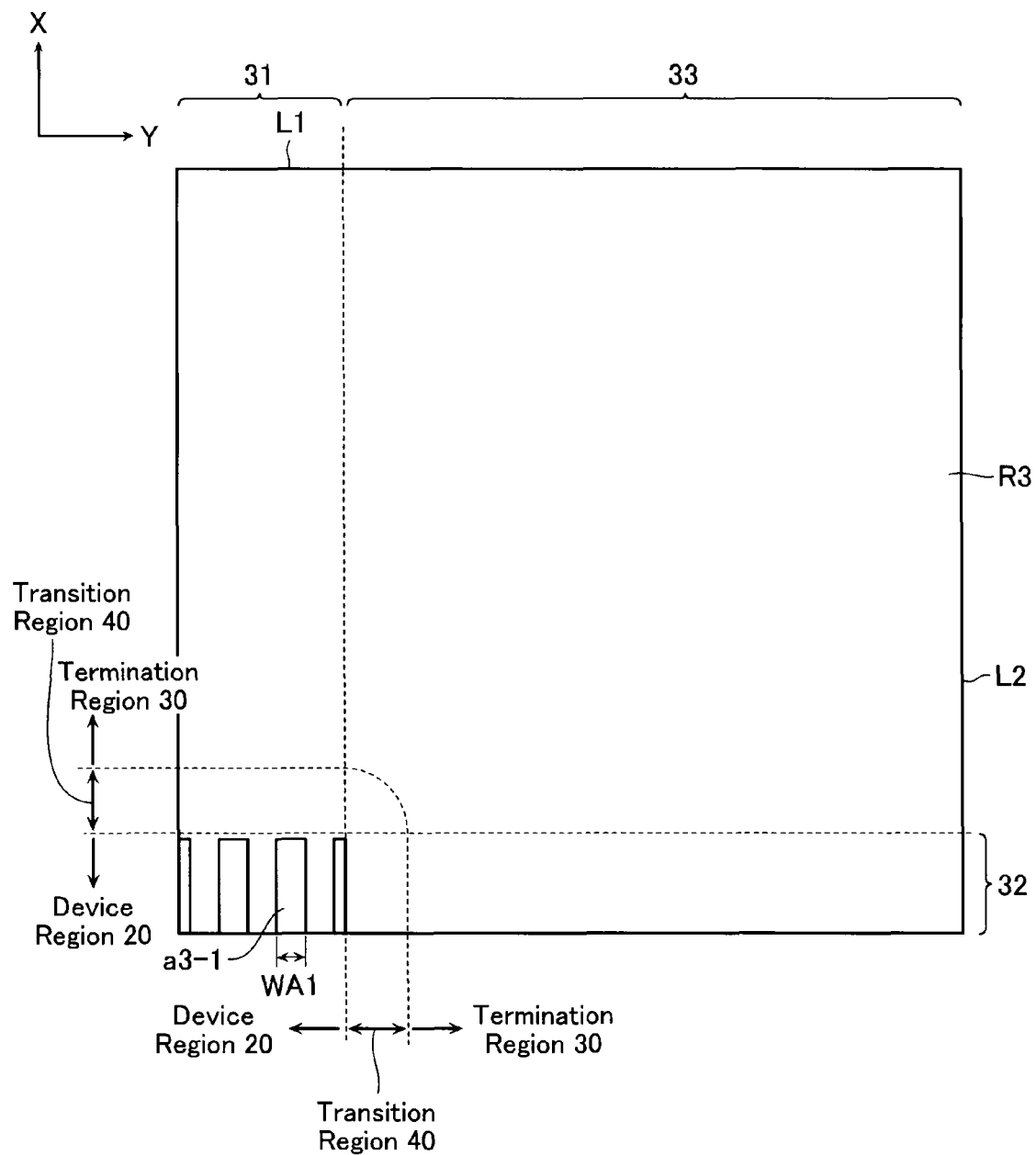
FIG. 7A is a plan view to explain the method of manufacturing the semiconductor device according to the embodiment of the present invention.

Then, for example, an oxide film is formed as a protection film on the n-type epitaxial layer on the $n^+$ type semiconductor substrate 1. Further, as illustrated in FIG. 7A, a resist R3 is formed with apertures a3-1. The resist R3 has the apertures a3-1 only in the device region 20 of the chip on which the semiconductor device is formed.

As in the apertures a1-1 in the resist R1, the apertures a3-1 in the resist R3 in the device region 20 are provided in a lateral direction (the y direction of FIG. 7A) along the top surface of the $n^+$ type semiconductor substrate 1, providing a stripe form with a first direction (the x direction of FIG. 7A) taken as the longitudinal direction. In this case, in the device region 20, the apertures a3-1 are provided at the same locations as the apertures a1-1 in the resist R1, and they have the same aperture widths WA1 as the apertures a1-1.

Using the resist R3 as a mask, the ion implantation device performs ion implantation of p-type impurities, e.g., boron (B), into the n-type epitaxial layer. In the device region 20, since the apertures a3-1 in the resist R3 are provided at the same locations as the apertures a1-1 in the resist R1, a p-type impurity is implanted into the same location as the n-type epitaxial layer in the lower layer.

Figure 7B:
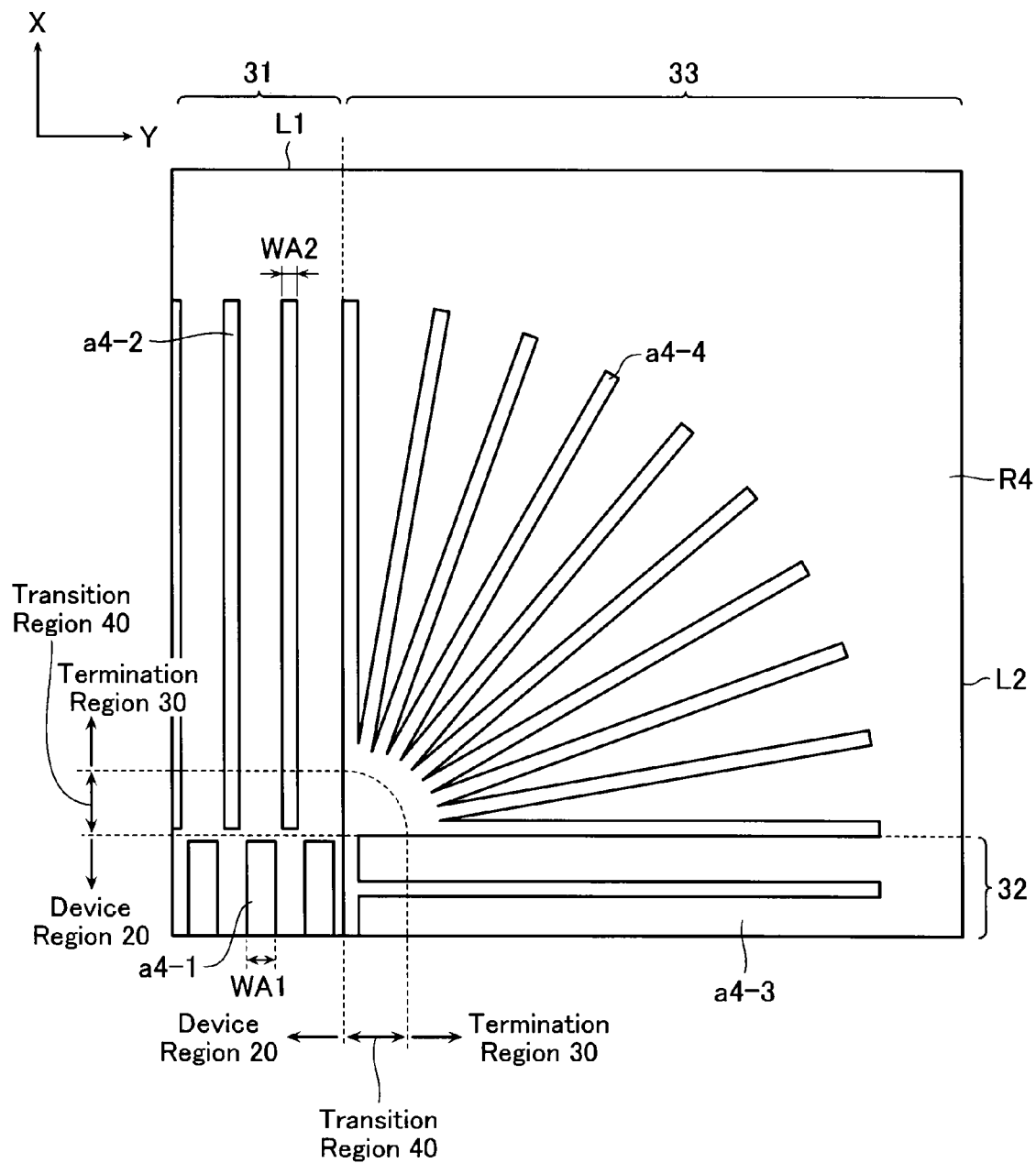
FIG. 7B is a plan view to explain the method of manufacturing the semiconductor device according to the embodiment of the present invention.

Then, after the resist R3 is stripped, a resist R4 with apertures a4-1 to a4-4 is formed as illustrated in FIG. 7B. The resist R4 has the apertures a4-1 in the device region 20 of the chip on which the semiconductor device is formed, and the apertures a4-2 to a4-4 in the termination region 30.

As in the apertures a1-1 in the resist R1, the apertures a4-1 in the resist R4 in the device region 20 are provided in a lateral direction (the y direction of FIG. 7B) along the top surface of the $n^+$ type semiconductor substrate 1, providing a stripe form with a first direction (the x direction of FIG. 7B) taken as the longitudinal direction. In this case, the apertures a4-1 are provided to be offset from the apertures a3-1 in the resist R3 by half a pitch. That is, in the device region 20, the apertures a4-1 are provided at the same locations as the apertures a2-1 in the resist R2.

As in the apertures a4-1 in the device region 20, the apertures a4-2 in the resist R4, at the peripheral part 31 of the termination region 30, have a stripe form with a first direction (the x direction of FIG. 7B) taken as the longitudinal direction. In this case, the apertures a4-2 at the peripheral part 31 have the aperture widths WA2 smaller than the aperture widths WA1 of the apertures a4-1 in the device region 20. At the peripheral part 31 of the termination region 30, the apertures a4-2 are provided at the same locations as the apertures a1-2 in the resist R1.

The apertures a4-3 in the resist R4, at the peripheral part 32 of the termination region 30, have a stripe form with a direction orthogonal to the circumference L2 of the termination region 30 (the y direction of FIG. 7B) taken as the longitudinal direction. The apertures a4-3 at the peripheral part 32 have the aperture widths substantially the same as the aperture widths WA2 of the apertures a4-2 at the peripheral part 31. At the peripheral part 32 of the termination region 30, the apertures a4-3 are provided at the same locations as the apertures a1-3 in the resist R1.

At the corner part 33 of the termination region 30, the apertures a4-4 in the resist R1 are provided in a radial manner from the device region 20 towards the circumferences L1 and L2 of the corner part 33. The apertures a4-4 at the corner part 33 have the aperture widths substantially the same as the aperture widths WA2 of the apertures a4-2 at the peripheral part 31. At the corner part 33 of the termination region 30, the apertures a4-4 are provided at the same locations as the apertures a1-4 in the resist R1.

Using the resist R4 as a mask, the ion implantation device performs ion implantation of n-type impurities, e.g., phosphorus (P), into the n-type epitaxial layer. In the device region 20, since the apertures a4-1 in the resist R4 are offset from the apertures a3-1 in the resist R3 by half a pitch, n-type impurities are implanted into the intermediate points of the previously implanted p-type impurities.

In the device region 20, additional p-type impurities are implanted into the same locations as the p-type impurities have previously been implanted, and additional n-type impurities are implanted into the same locations as the n-type impurities have previously been implanted, respectively, with respect to the n-type epitaxial layer in the lower layer.

In addition, in the termination region 30, since the apertures a4-2 to a4-4 in the resist R4 are provided at the same locations as the apertures a1-2 to a1-4 in the resist R1, n-type impurities are implanted into the n-type epitaxial layer in the lower layer at the same locations as the p-type impurities have previously implanted.

Subsequently, after removing the oxide film and the resist R4, another n-type epitaxial layer is further formed on the n-type epitaxial layer with a thickness of e.g., on the order of 5.0 to 10.0 μm.

Thereafter, the ion implantation as illustrated in FIGS. 6A to 7B is performed on the multiple n-type epitaxial layers. Then, for example, heat treatment is performed on the laminated n-type epitaxial layers to diffuse the n-type impurities and the p-type impurities.

In the device region 20, the n-type impurities and the p-type impurities are implanted into the laminated n-type epitaxial layers, with each offset by half a pitch. As a result, such super junction regions may be alternately provided in the lateral direction (the y direction of FIG. 3) along the top surface of the $n^+$ type semiconductor substrate 1, providing a stripe form with the first direction (the x direction of FIG. 2) taken as the longitudinal direction.

In addition, in the termination region 30, only one of n-type impurity or p-type impurity is implanted into one of the n-type epitaxial layers. As a result, such super junction regions may be formed where the n-type pillar regions 12 and the p-type pillar regions 13 are alternately laminated in a direction parallel to the n+ type semiconductor substrate 1.

After forming the super junction regions, a well-known MOSFET manufacturing process may be used to provide the semiconductor device as illustrated in FIG. 3.

When the manufacturing method according to this embodiment is used, a smaller amount of impurities can be implanted into the termination region 30 than that implanted into the device region 20, since the resist aperture width WA2 in the termination region 30 is smaller than the resist aperture width WA1 in the device region 20. Accordingly, the n-type pillar regions 12 and the p-type pillar regions 13 in the termination region 30 may be formed with a lower impurity concentration than the n-type pillar regions 2 and the p-type pillar regions 3 in the device region 20. This facilitates the extension of depletion layers in the termination region 30 and enables the termination region 30 to have a higher breakdown voltage than the device region 20.

In addition, in the termination region 30, the apertures a1-2 to a1-3 in the resist R1 that are used for implantation of p-type impurity have the same aperture widths WA2 as the apertures a4-2 to a4-3 in the resist R4 that are used for implantation of n-type impurity. This enables the n-type impurities and the p-type impurities that are implanted into the respective n-type pillar regions 12 and p-type pillar regions 13 to be formed with substantially the same impurity concentration. This may prevent breakdown voltage reduction caused by a disruption of charge balance in the pillar regions of the termination region 30.

Then, the resist apertures are provided in a radial manner at the corner part 33 of the termination region 30. This results in radial impurity concentration peaks in the impurity concentration distribution of the n-type impurities and the p-type impurities. In addition, the amount of impurities implanted per unit volume at the corner part of the termination region 30 decreases as being closer to the circumferences L1 and L2 of the corner part 33. The corner part 33 may provide higher breakdown voltage because the troughs in the radial impurity concentration distribution of the n-type pillar regions 12 and the p-type pillar regions 13 provided at the corner part 33 of the termination region 30 represent still lower impurity concentration than the average impurity concentration of the corner part 33.

(Other Examples of Manufacturing Method of Semiconductor Device)

Figure 9:
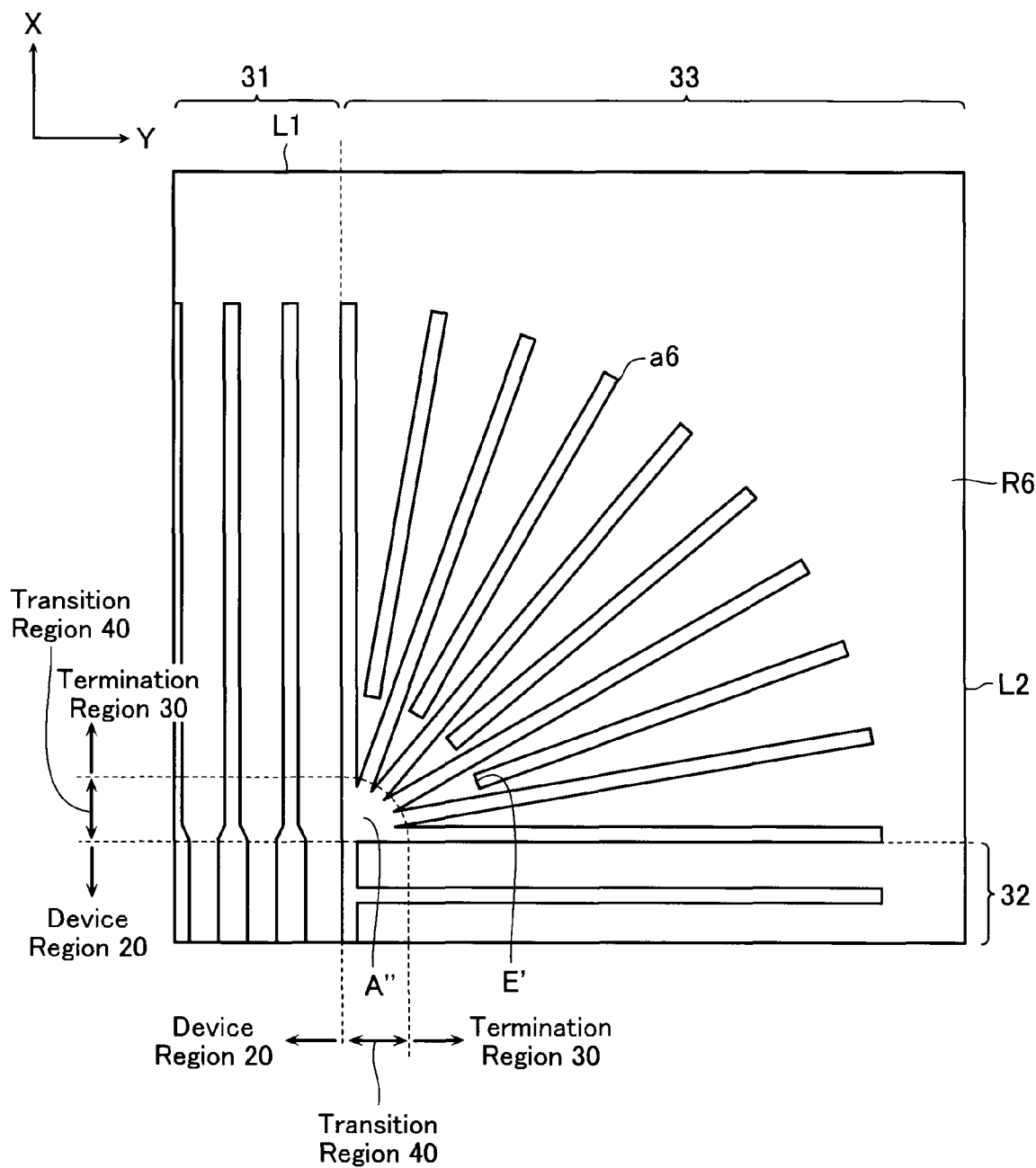
FIG. 9 is a plan view to explain another example method of manufacturing the semiconductor device according to the embodiment of the present invention.

Other examples of resists used in the manufacturing method of the semiconductor device according to this embodiment will now be described below with reference to the drawings. FIGS. 8 and 9 are enlarged plan views illustrating the termination region 30 including the corner part 33 of the chip on which the semiconductor device according to this embodiment is formed.

The resists R1 and R4 illustrated in FIGS. 6A and 7B have those resist apertures with large areas near the device region 20 at the corner part 33 of the termination region 30. This may result in a larger amount of dosage of n-type impurity and p-type impurity being implanted into the termination region 30 than in the device region 20. If the termination region 30 has higher impurity concentration than the device region 20, then depletion layers are less formable during the off-operation of the semiconductor device, which would result in reduction of the breakdown voltage.

In contrast, in a resist R5 as illustrated in FIG. 8, a plurality of apertures a5 that are provided in a radial manner at the corner part 33 of the termination region 30 are separated from their neighboring apertures a5. The apertures a5 are provided in a radial manner, originating from a location E spaced by a certain distance from a point A' where the corner part 33 contacts the device region 20.

As a result, the amount of dosage of n-type impurity and p-type impurity near the device region 20 will not become larger than in the device region 20, which may prevent reduction of the breakdown voltage at the corner part 33 of the termination region 30.

In addition, in a resist R6 as illustrated in FIG. 9, apertures a6 that are provided in a radial manner at the corner part 33 of the termination region 30 are separated on an every other basis and provided in a radial manner, originating from a location E' spaced by a certain distance from a point A' where the corner part 33 contacts the device region 20.

The apertures a6 may not also provide a larger amount of dosage of n-type impurity and p-type impurity near the device region 20 than in the device region 20, which may prevent reduction of the breakdown voltage at the corner part 33 of the termination region 30.

While embodiments of the present invention have been described, the present invention is not intended to be limited to the disclosed embodiments and various other changes or additions may be made thereto, or any combinations thereof may be possible without departing from the spirit of the invention. Although the embodiments have been described as the first-conductivity-type being n-type and the second conductivity-type being p-type, it should be appreciated, for example, that these embodiments may be implemented with the first-conductivity-type being p-type and the second conductivity-type being n-type.

In addition, the manufacturing method of the semiconductor device according to the embodiments of the present invention has been described in the context of n-type impurities and p-type impurities being implanted into the n-type epitaxial layer. This method may be implemented by forming a high concentration $n^+$ type epitaxial layer and alternately using the resists as illustrated in FIGS. 6A and 7A for implantation of p-type impurities, e.g., boron (B). The semiconductor device according to this embodiment may also be manufactured utilizing the alternative method.

While the semiconductor device has been described as a planar-gate-type MOSFET in the embodiments described above, it may be of trench-gate-type MOSFET. In addition, it may be implemented in combination with the termination region 30 in various structures, such as providing a p-type guard ring region for mitigating electric fields in the termination region 30, or providing a low concentration $p^-$ type RESURF region on the semiconductor substrate surface for depleting the termination region 30.

In addition, while the MOSFET using silicon as semiconductor material has been described in the above-mentioned embodiments, compound semiconductors such as silicon carbide (SiC) or gallium nitride (GaN), or wide band gap semiconductors such as diamond may be used as the semiconductor material. Further, while the present invention has been described as a MOSFET with a super junction region, it will be understood that this description is also applicable to any other semiconductor devices with a super junction region, such as SBD (Schottky Barrier Diode), consolidated devices including SBD and MOSFET, SIT (Static Induction Transistor), or IGBT.

What is claimed is:

1. A semiconductor device comprising:
   a first-conductivity-type semiconductor substrate having mutually opposing top and bottom surfaces;
   a super junction region having a first-conductivity-type first semiconductor pillar region and a second-conductivity-type second semiconductor pillar region alternately provided on the semiconductor substrate;
   a device region having a second-conductivity-type semiconductor base region on the super junction region; and
   a termination region being provided on the super junction region outside of an end portion of the semiconductor base region and around a circumference of the device region,
   the first semiconductor pillar region and the second semiconductor pillar region in a device region having a stripe form in a first direction along the semiconductor substrate taken as a longitudinal direction,
   the first semiconductor pillar region and the second semiconductor pillar region in a termination region having a lamination form resulting from alternate lamination of the first semiconductor pillar region and the second semiconductor pillar region on the top surface of the semiconductor substrate, the first semiconductor pillar region and/or the second semiconductor pillar region at a corner part of the termination region exhibiting an impurity concentration distribution such that a plurality of impurity concentration peaks appear periodically along a curve proceeding from the first direction to a second direction orthogonal to the first direction at the corner part, and having an impurity amount such that it becomes smaller as being closer to the circumference of the corner part.

2. The semiconductor device according to claim 1, wherein the first semiconductor pillar region exhibiting an impurity concentration distribution such that a plurality of impurity concentration peaks appear periodically at the corner part of the termination region has a lower impurity concentration than that of the first semiconductor pillar region in the device region, and/or
the second semiconductor pillar region exhibiting an impurity concentration distribution such that a plurality of impurity concentration peaks appear periodically at the corner part of the termination region has a lower impurity concentration than that of the second semiconductor pillar region in the device region.

3. The semiconductor device according to claim 1, wherein the first semiconductor pillar region in the termination region has an impurity concentration substantially the same as that of the second semiconductor pillar region in the termination region.

4. The semiconductor device according to claim 1, wherein the first semiconductor pillar region and the second semiconductor pillar region alternately provided in the termination region have a width of one repetition unit smaller than that of the first semiconductor pillar region and the second semiconductor pillar region alternately provided in the device region.

5. The semiconductor device according to claim 1, wherein the second semiconductor pillar region formed in the device region is electrically connected to the second semiconductor pillar region formed in the termination region.

6. The semiconductor device according to claim 1, wherein the termination region has a width as a distance between the end portion of the semiconductor base region and an end portion of the first and second semiconductor pillar region at a circumference of the semiconductor substrate, the width being equal to or greater than respective heights perpendicular to the semiconductor substrate of the first semiconductor pillar region and the second semiconductor pillar region formed in the device region.

7. The semiconductor device according to claim 1, wherein the termination region has a width as a distance between the end portion of the semiconductor base region and an end portion of the first and second semiconductor pillar region at a circumference of the semiconductor substrate, the width being larger than respective heights perpendicular to the semiconductor substrate of the first semiconductor pillar region and the second semiconductor pillar region formed in the device region, by a factor of 1.1 to 1.5.

8. A semiconductor device comprising:
a first-conductivity-type semiconductor substrate having mutually opposing top and bottom surfaces;
a super junction region having a first-conductivity-type first semiconductor pillar region and a second-conductivity-type second semiconductor pillar region alternately provided on the semiconductor substrate;
a device region having a second-conductivity-type semiconductor base region on the super junction region; and
a termination region being provided on the super junction region outside of an end portion of the semiconductor base region and around a circumference of the device region,
the first semiconductor pillar region and the second semiconductor pillar region in a device region having a stripe form in a first direction along the semiconductor substrate taken as a longitudinal direction,
the first semiconductor pillar region and the second semiconductor pillar region in a termination region having a lamination form resulting from alternate lamination of the first semiconductor pillar region and the second semiconductor pillar region on the top surface of the semiconductor substrate, and
the first semiconductor pillar region and/or the second semiconductor pillar region at a corner part of the termination region having an impurity amount such that it becomes smaller as being closer to the circumference of the corner part.

9. The semiconductor device according to claim 8, wherein the first semiconductor pillar region having an impurity amount such that it becomes smaller as being closer to the circumference of the corner part of the termination region has a lower impurity concentration than that of the first semiconductor pillar region in the device region, and/or
the second semiconductor pillar region having an impurity amount such that it becomes smaller as being closer to the circumference of the corner part of the termination region has a lower impurity concentration than that of the second semiconductor pillar region in the device region.

10. The semiconductor device according to claim 8, wherein
the first semiconductor pillar region in the termination region has an impurity concentration substantially the same as that of the second semiconductor pillar region in the termination region.

11. The semiconductor device according to claim 8, wherein
the first semiconductor pillar region and the second semiconductor pillar region alternately provided in the termination region have a width of one repetition unit smaller than that of the first semiconductor pillar region and the second semiconductor pillar region alternately provided in the device region.

12. The semiconductor device according to claim 8, wherein
the second semiconductor pillar region formed in the device region is electrically connected to the second semiconductor pillar region formed in the termination region.

13. The semiconductor device according to claim 8, wherein
the termination region has a width as a distance between the end portion of the semiconductor base region and an end portion of the first and second semiconductor pillar region at a circumference of the semiconductor substrate, the width being equal to or greater than respective heights perpendicular to the semiconductor substrate of the first semiconductor pillar region and the second semiconductor pillar region formed in the device region.

14. The semiconductor device according to claim 8, wherein
the termination region has a width as a distance between the end portion of the semiconductor base region and an end portion of the first and second semiconductor pillar region at a circumference of the semiconductor substrate, the width being larger than respective heights perpendicular to the semiconductor substrate of the first semiconductor pillar region and the second semiconductor pillar region formed in the device region, by a factor of 1.1 to 1.5.

* * * * *